United States Patent [19]

Yumoto

[11] Patent Number: 4,812,275
[45] Date of Patent: * Mar. 14, 1989

[54] PROCESS FOR THE PRODUCTION OF MOLDED ARTICLES HAVING PARTIAL METAL PLATING

[75] Inventor: Tetsuo Yumoto, Tokorozawa, Japan

[73] Assignee: Sankyo Kasei Kabushiki Kaisha, Tokyo, Japan

[*] Notice: The portion of the term of this patent subsequent to Mar. 14, 2006 has been disclaimed.

[21] Appl. No.: 109,353

[22] Filed: Oct. 15, 1987

[30] Foreign Application Priority Data

Nov. 18, 1986 [JP] Japan .................. 61-273035

[51] Int. Cl.$^4$ .............................. B29C 59/00
[52] U.S. Cl. ..................... 264/129; 264/135; 427/96; 427/98; 427/306
[58] Field of Search .............. 427/96, 98, 306; 264/129, 135

[56] References Cited

U.S. PATENT DOCUMENTS

| | | | |
|---|---|---|---|
| 3,259,559 | 7/1966 | Schneble | 427/98 |
| 3,737,339 | 6/1973 | Alsberg | 427/98 |
| 3,884,704 | 5/1975 | Rantell | 427/98 |
| 4,389,771 | 6/1983 | Cassidy | 427/98 |
| 4,451,505 | 5/1984 | Jaus | 427/98 |
| 4,574,031 | 3/1986 | Dorey | 427/96 |
| 4,615,763 | 10/1986 | Gelorme | 427/96 |

FOREIGN PATENT DOCUMENTS

| | | | |
|---|---|---|---|
| EP192233 | 8/1986 | European Pat. Off. | 427/96 |
| 71272 | 6/1978 | Japan | 427/98 |
| 217695 | 10/1985 | Japan | 427/98 |

*Primary Examiner*—Shrive Beck
*Assistant Examiner*—Vi Duong Dang
*Attorney, Agent, or Firm*—Jordan and Hamburg

[57] ABSTRACT

This invention relates to a process for the production of a molded article partially plated with metal as in the case of circuit boards, connectors, decorative articles, etc., where a catalyst such as palladium, gold, etc. is added after roughening of the surface of the primary molded article, and then, the molded article is inserted into the mold and molded so that the portions to be plated with metal are exposed outwardly, and after such molding, the secondary molded material is plated with metal.

20 Claims, 2 Drawing Sheets

PROCESS FOR THE PRODUCTION OF MOLDED ARTICLES HAVING PARTIAL METAL PLATING

FIELD OF THE INVENTION AND RELATED ART STATEMENT

The present invention relates to a process for the production of a molded article such as a circuit board, connectors, etc. having a partial metal plating.

So far, a process for the production of molded articles having a partial plating has been disclosed in the official bulletin (The laying-open No. 61-239694 of Japanese Patent Application). This official bulletin specifies several production processes, of which two processes will now be explained.

The first process for production includes a molding process of molded articles, an adhesion promotion process and an inherent metal plating process.

In the molding process of the molded article, an alternate two shot injection molding is used. In the first shot, the first portion of a molded article equipped with a circuit pattern is molded the using the first electrically insulating material, while in the second shot a supporting structure is formed around the circuit pattern using a second electrically insulating material. Polyethersulfone with catalyst is used as the first electrically insulating material for forming the molded article, and the appropriate catalyst for filler material is a palladium catalyst scattered on powdered aluminium silicate, and the catalyst mixed in the electrically insulating material is catalytic for the material for electroless metal plating to be conducted in the adhesive metal plating process. The desirable second electrically insulating material for the supporting structure is polyethersulfone (without catalyst).

In the adhesion promotion process, the surfaces of the molded article are made micro porous and hydrophilic and the catalyst on the surface part of the circuit pattern and hole walls is exposed. Accordingly, all the flat, smooth and glittering surfaces of the molded article are matted. Further, in the metal plating process, the molded article is passed through vapor of dichloromethane, and the matted hydrophilic surfaces of the support structure are made flat, smooth and hydrophobic so that they can endure the metal plating from outside and once again will be returned to the metal plating solution. The reason why this kind of processes is required is to avoid such the situation that the palladium catalyst is not uniformly dispersed, the surface layers of the circuit pattern become rich with resin and, accordingly, the catalytic function of the surfaces are not brought into full play.

In the second production process the molded articles are formed by a two shot process, where not only the first electrically insulating material to be used in the first shot process for forming circuit pattern but also the second electrically insulating material to be used in the second shot molding process for molding the support structure are selected from materials having no catalyst. The molded articles are treated with an etching solution for adhesion promotion, then a catalyst for metal plating is added and further is activated for electroless metal plating, then the non-adhesive catalyst is washed away from the support structure and finally the circuit pattern is subjected to copper plating using a solution for electroless copper plating.

Both processes mentioned above involve problems.

The first problem in the production process of the former case is that the palladium catalyst is mixed into the first electrically insulating material for forming the circuit pattern. Palladium is an expensive precious metal. It needs to be mixed in large quantity in order to cause it to conduct a catalytic function for electroless metal plating, and accordingly, economical production is difficult. The second problem is that the former production process is complicated and deteriorates the working efficiency, since the process for making the matted surfaces flat and smooth needs to be included in the metal plating process, in addition to the need to matt all the smooth surfaces of the articles in order to expose the catalyst.

The problem in the production process of the latter case is that it requires work to wash away with spray the catalyst adhered to the portions other than the circuit pattern, that is to say, all the surfaces of the support structure, after activation of the molded articles but before electroless copper plating. It is time-consuming to ensure the removal of the catalyst. Especially, the work to wash away the catalyst adhering to the surface of the border portion of circuit pattern and support structure takes much time, costs much labor and is practically difficult. When the removal of the catalyst is incomplete in the molded articles, for instance, in the circuit boards, the portions other than circuit portions will definitely get metal plated, and the insulation of these portions is not secured. Therefore, they will not function as the circuit boards.

SUMMARY OF THE INVENTION

The present invention involves a process to mold a primary molded article, a process for conducting pre-treatment of the primary molded article by adding such catalyst as palladium, gold, silver, platinum, etc. after roughening of the surfaces of the primary molded article, a process for forming a secondary molded article where portions of the primary molded article to be plated with metal using plastic material and mold on the base of the pre-treated primary molded article are exposed, and a process for plating the secondary molded article with metal.

In addition to plastics, also ceramics etc. can be used as raw material for forming the primary and the secondary molded articles. The plastics material includes not only single plastics material, but also those mixed with filler such as glass fibre, potassium titanate fibre, and so on. The pre-treatment mentioned above can be done using a publicly known process. When the surfaces of the primary molded article are soiled with mold removing agent or fatty substance after forming of the primary molded article, it is advisable to conduct the removal of fat. Depending on the kind of plastics, for instance in the case of a primary molded article composed of polyamide resin, the fat can be removed by means of such organic solvents as methylethyl ketone, acetone, surface active agent, etc. Meantime, a variety of etching solutions are used in the pre-treatment process in order to improve the adhesion power of the plated metal. In the case of an article made of polyphenylene sulphide resin, such etching solutions as chromic acid/sulfuric acid, acidic ammonium fluoride/nitric acid and hydrofluoric acid/nitric acid are suitable.

When the primary molded article is made of plastics material, the way to add the catalyst can be selected as a practical one from (1) catalyst→accelerator method and (2) sensitizing→activating method. The former is a method for separating palladium on the surface of the primary molded article by activating with such acid as hydrochloric acid, sulfuric acid, etc. after dipping in a mixed catalytic solution of the family of tin and palladium. The latter is a method, where, at first a, relatively strong reducing agent such as tin chloride, hypophosphorous acid, hydrazinium chloride, etc. is adsorbed to the surfaces of the molded article, then the article is submerged in a catalytic solution that contains ions of a precious metal such as gold and palladium and finally the precious metal is separated on the surfaces of the molded article. It is usual to use chemical copper plating or chemical nickel plating in the metal plating process of the secondary molded article. However, if the molded article is a wiring board, the desirable process will be a copper plating.

The object of this invention is to provide an efficient and economical mass production process for partially metal plated, molded articles having functions as circuit boards, connectors, etc., not limiting to the field of decorative articles.

Another object of this invention is to plate with a minimal quantity of precious metal by applying the catalyst only to the surfaces of the primary molded article.

A further object of this invention is to abolish the process for washing away the catalyst and to improve production efficiency by using a mold for forming the secondary molded article where portions of the primary molded article bestowed with catalyst and to be metal plated are exposed.

Another object of this invention is to make it possible to secure the complete insulation of portions other than circuit portions when the molded article is, for instance, a circuit board.

The special features of this invention will be more deeply understood from the following description, taken in conjunction with the accompanying drawings.

DESCRIPTION OF THE PREFERRED EMBODIMENTS

Example 1

<Primary molding process>

Figure 1:
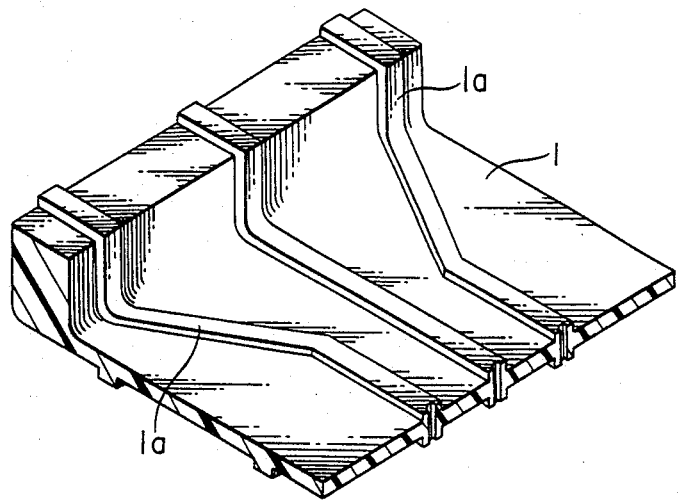
FIG. 1 is a perspective view of a circuit board as a primary molded article.

Board 1 as shown in FIG. 1 was molded as a primary molded article using a mold. A protruding pattern 1a was formed on the board.

Etching was conducted by submerging the board 1 for 5 minutes in an etching solution composed of acidic ammonium fluoride/nitric acid, at a temperature of 40° C., after subjecting the board 1 to a fat removing treatment.

After washing the board with water, sensitizing with tin chloride and activation with palladium chloride were carried out and, after that, the board was dried.

<Secondary molding process>

Figure 2:
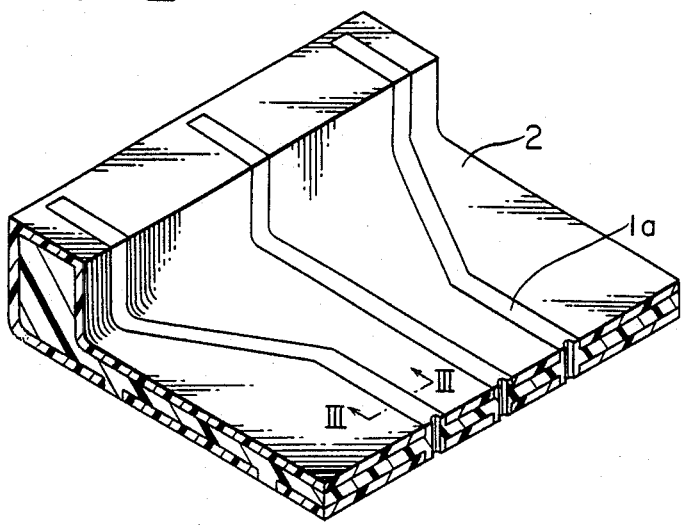
FIG. 2 is a perspective view of a circuit board as a secondary molded article.
Figure 3:
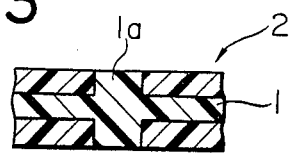
FIG. 3 is an enlarged sectional view taken along the line III—III of FIG. 2.
Figure 4:
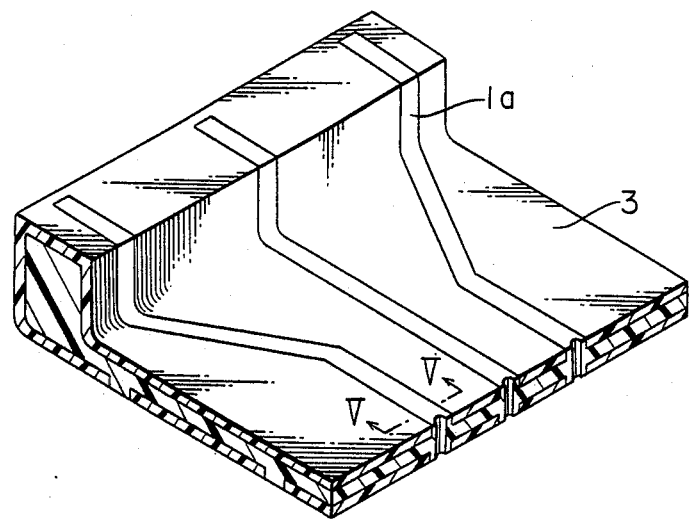
FIG. 4 is a perspective view of a circuit board as a product.
Figure 5:
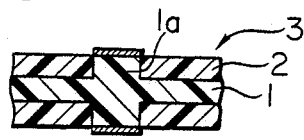
FIG. 5 is an enlarged sectional view taken along the line V—V of FIG. 4.

After drying, the board 1 was inserted into the cavity of the mold, then the cavity was filled with liquid plastic resin and a board 2 as a secondary molded article was formed as shown in FIG. 2. As shown in FIG. 3, the pattern 1a of the board 1 protrudes outwardly in the board 2. After the board 2 was subjected to fat removing treatment, an electroless metal plating was conducted to a thickness of 20 μm. By doing so, a circuit board 3 was obtained as a molded plastic article, where the pattern 1a of the outer surface of the board was plated with metal as shown in FIG. 4 and FIG. 5.

In both primary and secondary molding processes, a thermoplastic resin mixture composed of 60 weight % of polyphenylene sulphide resin, 35 weight % of glass fibre and 5 weight % of potassium titrate fibre (Timos D made by Otsuka Chemical) was used as raw material for the circuit board.

Example 2

The circuit board 3 was produced in the same way as Example 1. However, as raw material for the circuit board, a thermoplastic resin mixture composed of 70% of polyethersulphone resin and 30% of glass fibre was used.

Example 3

The primary molding process is same as that of Example 1, while in the secondary molding process the secondary molded was article 2, after having been molded, was again treated with catalyst and plated with metal. By doing so, the adhering strength of the metal plating was improved.

The measurement of the adhesion state of the metal plated circuit pattern of each Example proved that the adhering strength was strongest in the case of Example 3, followed by the case of the Example 1.

What is claimed is:

1. A process for producing a partially-plated molded article comprising the steps of molding within a first mold without a catalyst a primary article having a surface with protrusions, chemically roughening said surface and said protrusions of said primary molded article, treating said chemically-roughened surface and said chemically-roughened protrusions of said primary article with a catalyst, disposing said primary article with said chemically-roughened and catalytically-treated surfaces and protrusions within a second mold, molding within said second mold a secondary molded article about said first primary molded article such that at least some outer surface sections of said protrusions are exposed, and plating said exposed outer surface sections with metal.

2. A process according to claim 1 wherein said step of chemically roughening the surface of said primary molded article comprises submerging said primary molded article in an acid etching solution.

3. A process according to claim 2 wherein said acid etching solution is selected from the group consisting of chromic acid/sufuric acid, acidic ammonium fluoride/nitric acid, and hydrofluoric acid/nitric acid.

4. A process according to claim 1 wherein said catalyst is selected from the group consisting of palladium, gold, silver and platinum.

5. A process according to claim 1 further comprising cleansing said primary molded article with a solvent prior to said chemical-roughening step.

6. A process according to claim 5 wherein said solvent is an organic solvent.

7. A process according to claim 1 further comprising cleansing said secondary molded article with a solvent prior to said plating step.

8. A process according to claim 7 wherein said solvent is an organic solvent.

9. A process according to claim 1 wherein said primary molded article comprises a first plastic material.

10. A process according to claim 9 wherein said secondary molded article comprises a plastic material.

11. A process according to claim 1 wherein said primary molded article comprises a ceramic material.

12. A process according to claim 11 wherein said secondary molded article comprises a ceramic material.

13. A process according to claim 1 wherein said plating comprises electroless metal plating.

14. A process according to claim 13 wherein said electroless metal plating is selected from the group consisting of chemical copper plating and chemical nickel plating.

15. A process according to claim 1 wherein said primary and secondary molded articles comprise 60-weight percent polyphenylene sulphide resin, 35-weight percent glass fiber and 5-weight percent potassium titrate fiber.

16. A process according to claim 1 wherein said primary and secondary molded articles comprise 70-weight percent polyethersulfone resin and 30-weight percent glass fiber.

17. A process according to claim 1 wherein said catalyst treatment comprises submerging said primary molded article in a mixed catalytic solution of tin and palladium, and activating said mixed catalytic solution with an acid to separate palladium onto the surfaces and protrusions of the primary molded article.

18. A process according to claim 17 wherein said acid is selected from the group consisting of hydrochloric acid and sulfuric acid.

19. A process according to claim 1 wherein said catalyst treatment comprises absorbing a strong reducing agent on the surfaces and protrusions of said primary molded article to sensitize said surfaces and protrusions, and submerging said primary molded article in a catalytic solution containing precious metal ions to separate precious metal onto the surfaces and protrusions of the primary molded article.

20. A process according to claim 19 wherein said strong reducing agent is tin chloride and said catalytic solution comprises palladium chloride.

* * * * *